United States Patent
Chen et al.

(10) Patent No.: US 11,183,971 B2
(45) Date of Patent: Nov. 23, 2021

(54) METHOD FOR STARTUP OF CRYSTAL OSCILLATOR WITH AID OF EXTERNAL CLOCK INJECTION, ASSOCIATED CRYSTAL OSCILLATOR AND MONITORING CIRCUIT THEREIN

(71) Applicant: MEDIATEK INC., Hsin-Chu (TW)

(72) Inventors: Chien-Wei Chen, Hsinchu (TW); Yu-Li Hsueh, Hsinchu (TW); Po-Chun Huang, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 17/026,275

(22) Filed: Sep. 20, 2020

(65) Prior Publication Data
US 2021/0091720 A1   Mar. 25, 2021

Related U.S. Application Data

(60) Provisional application No. 62/905,579, filed on Sep. 25, 2019.

(51) Int. Cl.
 *H03B 5/06* (2006.01)
 *G01R 25/00* (2006.01)
 *H03B 5/36* (2006.01)
 *H03B 5/32* (2006.01)

(52) U.S. Cl.
 CPC ............. *H03B 5/06* (2013.01); *G01R 25/005* (2013.01); *H03B 5/32* (2013.01); *H03B 5/362* (2013.01);
 (Continued)

(58) Field of Classification Search
 CPC .. H03B 5/06; H03B 2200/0094; H03B 5/364; H03B 5/32; H03B 5/362; H03B 5/36;
 (Continued)

(56) References Cited

U.S. PATENT DOCUMENTS 6,819,195 B1   11/2004   Blanchard
7,579,919 B1    8/2009   Cao
(Continued)

FOREIGN PATENT DOCUMENTS

CN   104272538 A    1/2015
EP    0 739 092 A1  10/1996
(Continued)

OTHER PUBLICATIONS

Karim M. Megawer, Nilanjan Pal, Ahmed Elkholy, Mostafa G. Ahmed, Amr Khashaba, Danielle Griffith, Pavan Kumar Hanumolu, "A 54MHz Crystal Oscillator with 30× Start-Up Time Reduction Using 2-Step Injection in 65nm CMOS", ISSCC, 2019, IEEE, USA. , Feb. 17, 2019.
(Continued)

*Primary Examiner* — Ryan Johnson
(74) *Attorney, Agent, or Firm* — Winston Hsu

(57) ABSTRACT

A method for startup of a crystal oscillator (XO) with aid of external clock injection, associated XO and a monitoring circuit therein are provided. The XO includes an XO core circuit, an external oscillator, and an injection switch, where a quality factor of the external oscillator is lower than a quality factor of the XO core circuit. The method includes: utilizing the external oscillator to generate an injected signal; turning on the injection switch to make energy of the injected signal be injected into the XO core circuit, where an amplitude modulation (AM) signal is generated according to combination of the injected signal and an intrinsic oscillation signal from the XO core circuit; and controlling the external oscillator to selectively change an injection frequency of the injected signal according to the AM signal. More particularly, the injection switch is not turned off until the startup process is completed.

20 Claims, 14 Drawing Sheets

(52) U.S. Cl.
CPC ............... *H03B 2200/0074* (2013.01); *H03B 2200/0094* (2013.01)

(58) Field of Classification Search
CPC .. H03B 2200/0074; H03L 3/00; G01R 25/005
See application file for complete search history.

(56) References Cited

U.S. PATENT DOCUMENTS

| | | | |
|---|---|---|---|
| 9,246,435 B1 * | 1/2016 | Kavousian | ................ H03L 7/00 |
| 9,515,603 B2 * | 12/2016 | Matsuo | ..................... H03L 3/00 |
| 2006/0261860 A1 | 11/2006 | Yamada | |
| 2009/0015342 A1 | 1/2009 | Kleveland | |
| 2011/0298547 A1 | 12/2011 | Hanafi | |
| 2017/0310278 A1 | 10/2017 | Sachs | |
| 2018/0198411 A1 | 7/2018 | Stenman | |
| 2018/0328966 A1 | 11/2018 | Dahl | |
| 2020/0244220 A1 | 7/2020 | Van der Zee | |

FOREIGN PATENT DOCUMENTS

| | | | |
|---|---|---|---|
| EP | 0739092 A1 * | 10/1996 | ............ H03F 3/005 |
| TW | 201711374 A | 3/2017 | |

OTHER PUBLICATIONS

Bram Verhoef, Jan Prummel, Wim Kruiskamp, Rein Post, "A 32MHz Crystal Oscillator with Fast Start-up Using Synchronized Signal Injection", ISSCC, 2019, IEEE, USA. , Feb. 17, 2019.

* cited by examiner

METHOD FOR STARTUP OF CRYSTAL OSCILLATOR WITH AID OF EXTERNAL CLOCK INJECTION, ASSOCIATED CRYSTAL OSCILLATOR AND MONITORING CIRCUIT THEREIN

CROSS REFERENCE TO RELATED APPLICATIONS

This application claims the benefit of U.S. provisional application No. 62/905,579, which was filed on Sep. 25, 2019, and is included herein by reference.

BACKGROUND

The present invention is related to fast startup of crystal oscillators (XOs), and more particularly, to a method for startup of an XO with aid of external clock injection, associated XO and a monitoring circuit therein.

For future communications application (e.g. a duty-cycled wireless/wired system), when there is no data to be sent or received, a crystal oscillator (XO) within a communications device may enter a sleep mode (e.g. disable oscillation of the XO) in order to save power; and when there is data to be sent or received, the XO may enter a wakeup mode for startup of oscillation, and then enter a listen mode which has steady oscillation, allowing the communications device to normally send or receive data.

For example, a time period corresponding to the listen mode may be 1 millisecond (ms), and a time period corresponding to the wakeup mode (which may be referred to as a startup time $T_{START}$) may be 5 ms, where the wakeup mode may be power consuming (e.g. consume 42.7% of total power). Thus, the startup time of the XO could be a bottleneck in reducing average power. A designer may try to reduce the startup time by controlling a negative resistance within the XO, but this may introduce additional power consumption. Thus, there is a need for a novel startup method of the XO and associated architecture, to solve the problem of the related art.

SUMMARY

An objective of the present invention is to provide a method for startup of a crystal oscillator (XO) with aid of external clock injection, an associated XO and a monitoring circuit therein, to accelerate the startup of the XO without greatly increase additional power consumption.

At least one embodiment of the present invention provides a method for startup of an XO with aid of external clock injection. The method may comprise: utilizing an external oscillator external to an XO core circuit within the XO to generate an injected signal, wherein the XO comprises the XO core circuit, the external oscillator positioned outside of the XO core circuit, and at least one injection switch, the at least one injection switch is coupled between an injection node of the XO and an output terminal of the XO core circuit, the external oscillator is coupled to the injection node, and a quality factor of the external oscillator is lower than a quality factor of the XO core circuit; turning on the at least one injection switch to make energy of the injected signal be injected into the XO core circuit, thereby increasing energy of an intrinsic oscillation signal of the XO core circuit during a startup process of the XO, wherein a modulation signal is generated on the injection node according to combination of the injected signal and the intrinsic oscillation signal; and controlling the external oscillator to selectively change an injection frequency of the injected signal according to the modulation signal. More particularly, the at least one injection switch is turned on when the external oscillator selectively changes the injection frequency of the injected signal.

At least one embodiment of the present invention provides an XO. The XO may comprise an XO core circuit, an external oscillator, at least one injection switch and an frequency controller, wherein the external oscillator is coupled to an injection node of the XO, the at least one injection switch is coupled between an injection node of the XO and an output terminal of the XO core circuit, and the frequency controller is coupled to the external oscillator. The XO core circuit may be configured to generate an intrinsic oscillation signal within the XO core circuit. The external oscillator may be configured to generate an injected signal within the external oscillator, wherein a quality factor of the external oscillator is lower than a quality factor of the XO core circuit. For example, when the at least one injection switch is turned on, energy of the injected signal is injected into the XO core circuit to increase energy of the intrinsic oscillation signal during a startup process of the XO, and a modulation signal is generated on the injection node according to combination of the injected signal and the intrinsic oscillation signal. The frequency controller may be configured to receive the modulation signal and control the external oscillator to selectively change an injection frequency of the injected signal according to the modulation signal. More particularly, the at least one injection switch is turned on when the external oscillator selectively changes the injection frequency of the injected signal.

At least one embodiment of the present invention provides a monitoring circuit for generating consecutive comparison results of a sequence of demodulated voltages carrying information of relative phase between an injected signal and an intrinsic oscillation signal of a XO. The monitoring circuit may comprise an amplifier, a capacitor and a loop switch. The amplifier may be configured to receive the sequence of demodulated voltages through a first input terminal of the amplifier, wherein the sequence of demodulated voltages comprises a first voltage and a second voltage following the first voltage. The capacitor is coupled to a second input terminal of the amplifier, and the capacitor may be configured to sequentially store the sequence of demodulated voltages. The loop switch is coupled between the second input terminal and an output terminal of the amplifier, and the loop switch is configured to control configurations of the amplifier. For example, when the loop switch is turned on, the amplifier is configured as a unit gain buffer to transmit the first voltage from the first input terminal of the amplifier to the capacitor; and when the loop switch is turned off, the amplifier is configured as a comparator to compare the second voltage on the first terminal of the amplifier with the first voltage stored on the capacitor, and accordingly generates a comparison result of the consecutive comparison results, wherein the comparison result carrying information of relative phase between the injected signal and the intrinsic oscillation signal of a XO is utilized to control an injection frequency of the injection signal.

The startup method and the associated XO provided by embodiments of the present invention can utilize an external oscillator to inject energy into an XO core circuit, to accelerate the startup process of the XO. Advantageously, an injection switch coupled between the external oscillator and the XO core circuit can be always turned on during the startup process such that the efficiency of clock injection can be optimized. In some embodiments, when the injected frequency is adjusted (being locked to the intrinsic frequency of XO core circuit), the injection switch can be always turned on, at least be turned on for a duration, or be iteratively turned on and off to optimize or improve the clock injection efficiency. In comparison with the related art, overall startup time of the XO can be greatly reduced. Thus, the present invention can optimize an overall performance of the XO without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
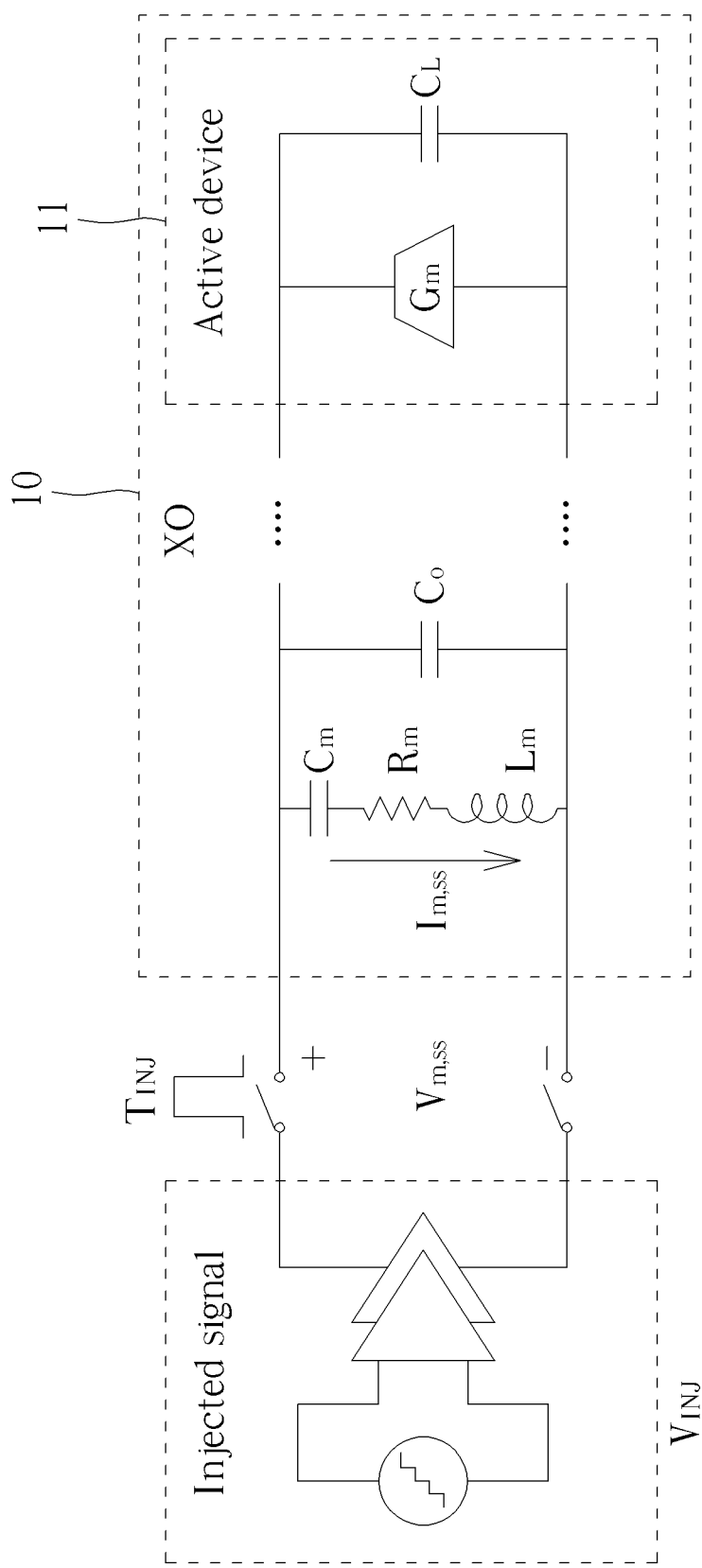
FIG. 1 is a diagram illustrating a concept regarding startup of a crystal oscillator (XO) with aid of external clock injection according to an embodiment of the present invention.

FIG. 1 is a diagram illustrating a concept regarding startup (e.g. fast startup) of a crystal oscillator (XO) with aid of external clock injection according to an embodiment of the present invention. For an oscillator having a high quality factor (which may be referred to as a high-Q oscillator), performance related to noise (e.g. phase noise) is much better than that of an oscillator having a low quality factor (which may be referred to as a low-Q oscillator), but startup time required by the high-Q oscillator may be much greater than startup time required by the low-Q oscillator. Examples of the high-Q oscillator may include, but are not limited to: a Pierce XO and a Colpitts XO. Examples of the low-Q oscillator may include, but are not limited to: a ring oscillator and a resistor-capacitor (RC) oscillator. A fast startup technique shown in FIG. 1 may turn on injection switches coupled between the low-Q oscillator and the high-Q oscillator during a period $T_{INJ}$, and inject energy of an injected signal $V_{INJ}$ of the low-Q oscillator into the high-Q oscillator (e.g. an XO 10 comprising an active device 11 (with a transconductance $G_m$ and a load capacitor $C_L$ therein), capacitors $C_m$ and $C_o$, a resistor $R_m$ and an inductance $L_m$), thereby increasing energy (e.g. $V_{m,ss}$ and $I_{m,ss}$) of an intrinsic oscillation signal of the high-Q oscillator during a startup process of the XO, in order to accelerate the startup of the XO and allow the XO to output the intrinsic oscillation signal.

In practice, an injection frequency of the low-Q oscillator is usually different from an intrinsic frequency of the high-Q oscillator at the beginning of the startup process, e.g. ±6000 parts per million (ppm), and therefore phase error between the injected signal and the intrinsic oscillation signal may be gradually accumulated. In some embodiments, the fast startup technique shown in FIG. 1 may further utilize a feedback control mechanism, which detects the intrinsic frequency and accordingly modify the low-Q oscillator, in order to make the injection frequency approach the intrinsic frequency. In detail, the injection switch may be turned on during a first injection period, and energy of the intrinsic oscillation signal may increase, where the injected signal may dominate an overall waveform (e.g. combination of the injected signal and the intrinsic oscillation signal) on a connected node of the low-Q oscillator and the high-Q oscillator, since the intrinsic oscillation signal is not strong enough at the beginning. In order to detect the intrinsic frequency, the injection switch is then turned off during a lock/synchronization period following the first injection period, to allow the intrinsic frequency to be detected for controlling the low-Q oscillator. After the injection frequency approaches the intrinsic frequency, the injection switch is turned on again during a second injection period following the lock/synchronization period, and the clock injection proceeds.

Figure 2:
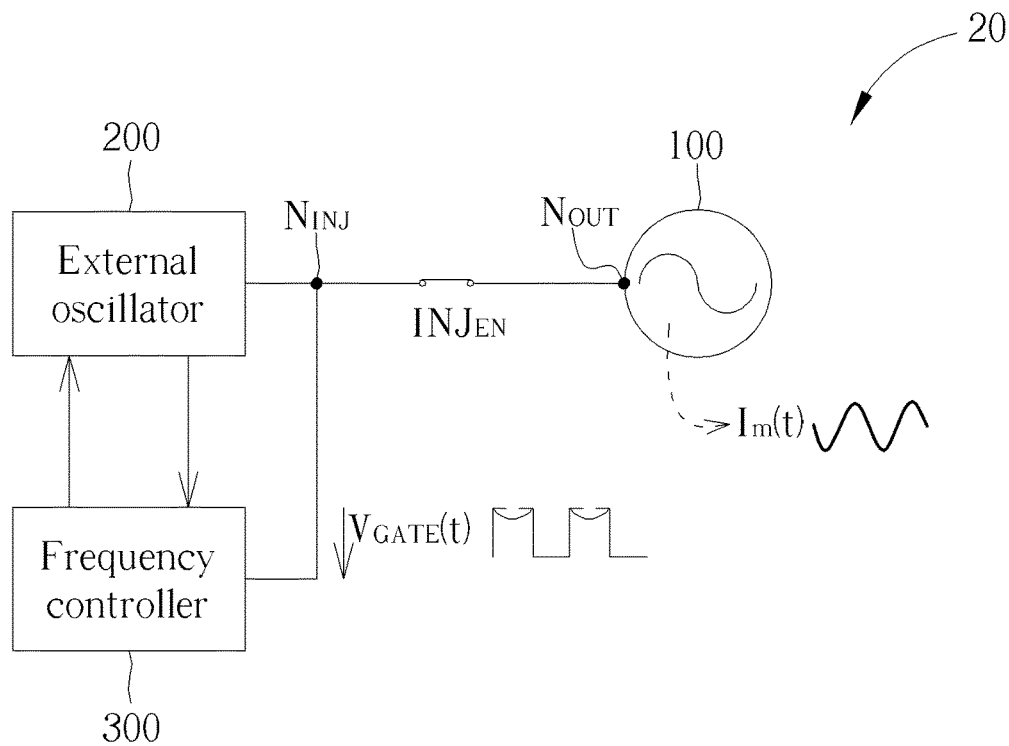
FIG. 2 is a diagram illustrating an XO according to an embodiment of the present invention.
Figure 3:
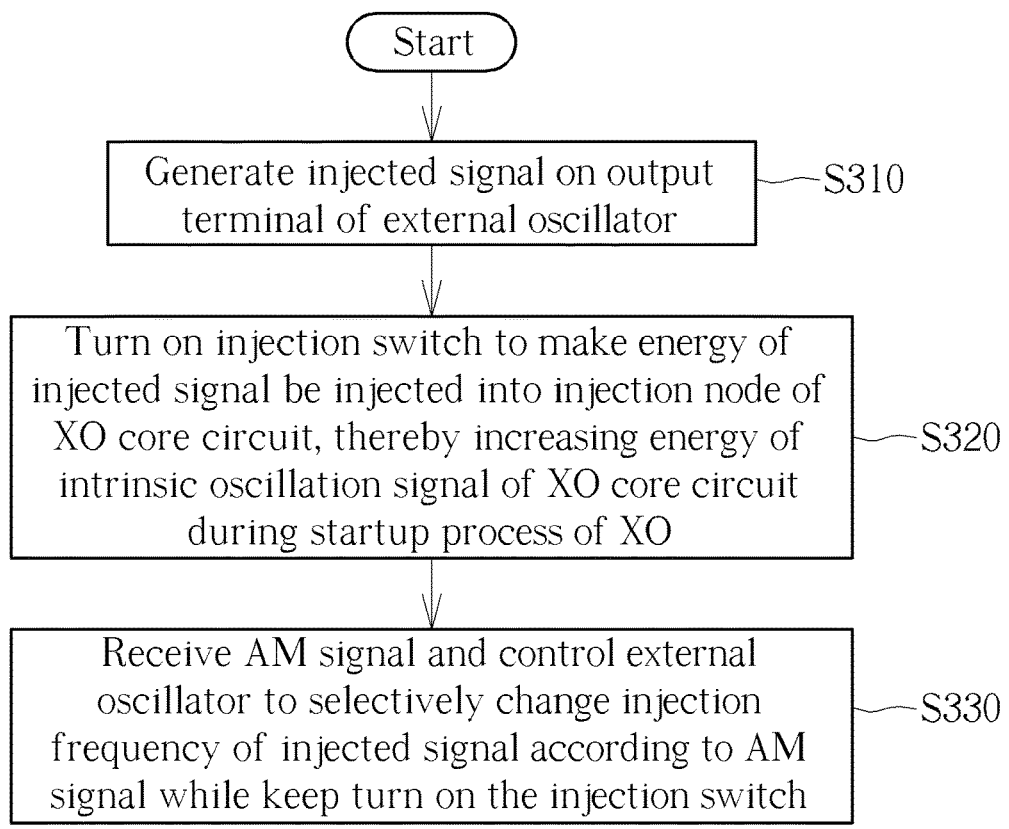
FIG. 3 is a flowchart illustrating a method for startup of the XO shown in FIG. 2 with aid of external clock injection according to an embodiment of the present invention.

FIG. 2 is a diagram illustrating an XO 20 according to an embodiment of the present invention. As shown in FIG. 2, the XO 20 may comprise an XO core circuit 100, an external oscillator 200 of the XO core circuit 100 (in particular, the external oscillator 200 is positioned outside the XO core circuit 100), at least one injection switch (e.g. one or more switches, which are collectively referred to as an injection switch controlled by a signal $INJ_{EN}$), and an frequency controller 300, wherein the injection switch is coupled between an injection node $N_{INJ}$ of the XO 20 and an output terminal $N_{OUT}$ of the XO core circuit 100, the external oscillator is coupled to the injection node $N_{INJ}$, and the frequency controller 300 is coupled to the external oscillator 200. In this embodiment, a quality factor of the external oscillator 200 is lower than a quality factor of the XO core circuit 100, where the XO core circuit 100 may be an example of the high-Q oscillator, and the external oscillator 200 may be an example of the low-Q oscillator. FIG. 3 is a flowchart illustrating a method for startup of the XO 20 shown in FIG. 2 with aid of external clock injection according to an embodiment of the present invention. It should be noted that the working flow shown in FIG. 3 is for illustrative purposes only, and is not a limitation of the present invention. One or more steps may be added, deleted or modified in the working flow shown in FIG. 3. In addition, if a same result may be obtained, these steps do not have to be executed in the exact order shown in FIG. 3. For better comprehension, please refer to FIG. 3 in conjunction with FIG. 2.

In Step S310, the external oscillator 200 may generate an injected signal (e.g. a low-Q signal) within the external oscillator 200. In this embodiment, an operating frequency of the frequency controller 300 is controlled by the external oscillator (e.g. the operating frequency of the frequency controller 300 may be equal to an injection frequency of the injected signal), but the present invention is not limited thereto.

In Step S320, a system (e.g. a duty-cycled wireless/wired system) comprising the XO 20 may utilize the signal $INJ_{EN}$ to turn on the injection switch to make energy of the injected signal be injected into the XO core circuit 100, thereby increasing energy (e.g. energy WO of a resonator) of an intrinsic oscillation signal of the XO core circuit 100 during a startup process of the XO 20. As the output terminal $N_{OUT}$ is coupled to the injection node $N_{INJ}$ when the injection switch is turned on, both the injected signal and the intrinsic oscillation signal may exist at the injection node $N_{INJ}$, and an amplitude modulation (AM) signal is generated on the injection node $N_{INJ}$ according to combination of the injected signal and the intrinsic oscillation signal. For example, the injected signal (e.g. an output square wave) may be modulated by the intrinsic oscillation signal to generate the AM signal, as illustrated by a waveform of a signal $V_{GATE}(t)$ shown in FIG. 1.

In Step S330, the frequency controller 300 may receive the AM signal and control the external oscillator 200 to selectively change the injection frequency of the injected signal according to the AM signal such as the waveform of the signal $V_{GATE}(t)$. More particularly, during the start-up process when the external oscillator selectively changes the injection frequency of the injected signal, the injection switch is always turned on (e.g., not turned off) or at least turned on for a duration.

Figure 4:
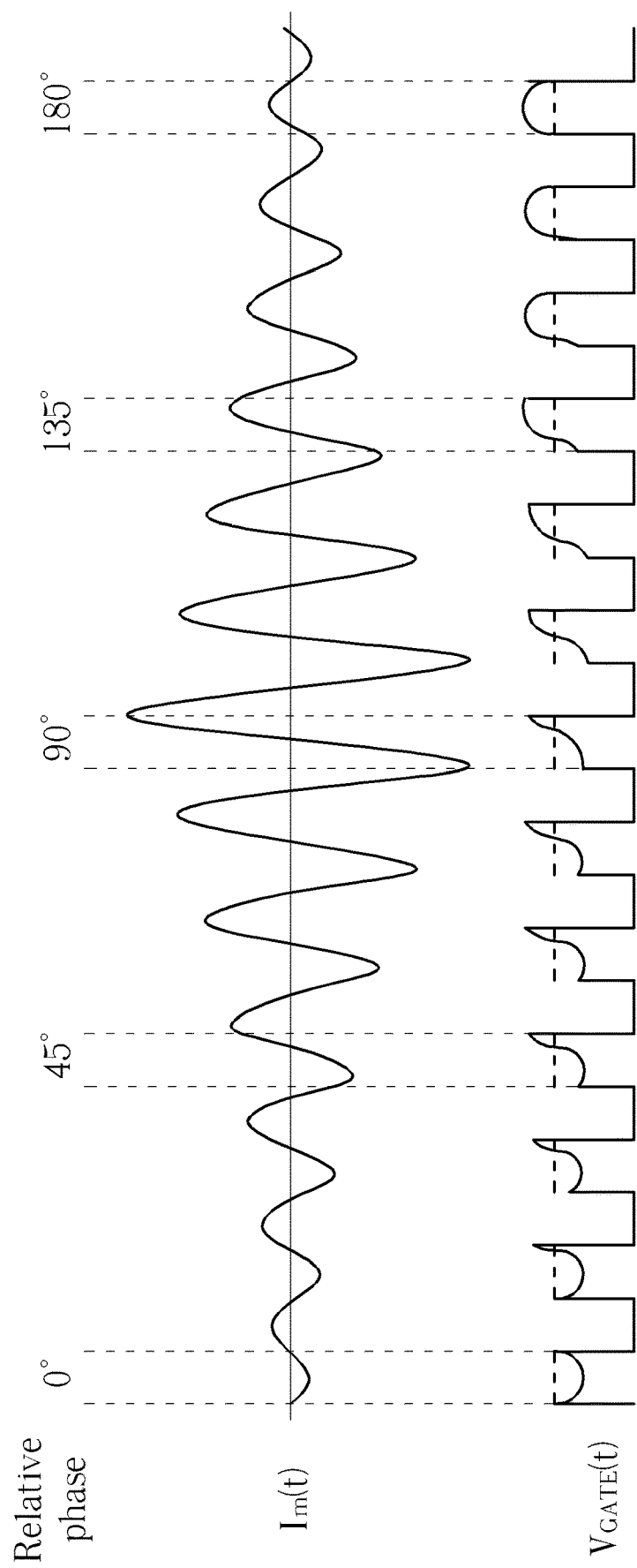
FIG. 4 is a diagram illustrating waveform patterns of some signals with varying relative phase according to an embodiment of the present invention.

It should be noted that different relative phases (e.g. phase error) between the injected signal and the intrinsic oscillation signal may result in different waveform patterns of the signal $V_{GATE}(t)$ as shown in FIG. 4, where the energy WO of the resonator within the XO core circuit 100 is also illustrated. For example, when the injection frequency (e.g. $F_{INJ}$) is not equal to the intrinsic frequency (e.g. $F_{XO}$), the phase error may accumulate with time and a beating behavior may show up, where an envelope period $T_{envelope}$ of the beating behavior may be calculated as follows:

$$T_{envelope} = \frac{1}{\Delta f} = \frac{1}{Finj - Fxo}$$

$\Delta f$ may represent a frequency difference between the injection frequency and the intrinsic frequency. In this embodiment, the waveform of the signal $V_{GATE}(t)$ may be regarded as a square wave from the external oscillator 200 being distorted by the intrinsic oscillation signal (which may be represented by $I_m(t)$ from the XO core circuit 100, and different distortions (e.g. beating envelopes) may correspond to different relative phases between the injected signal and the intrinsic oscillation signal. Thus, information related to relative phase between the injected signal and the intrinsic oscillation signal is carried by the AM signal such as the signal $V_{GATE}(t)$.

Figure 5:
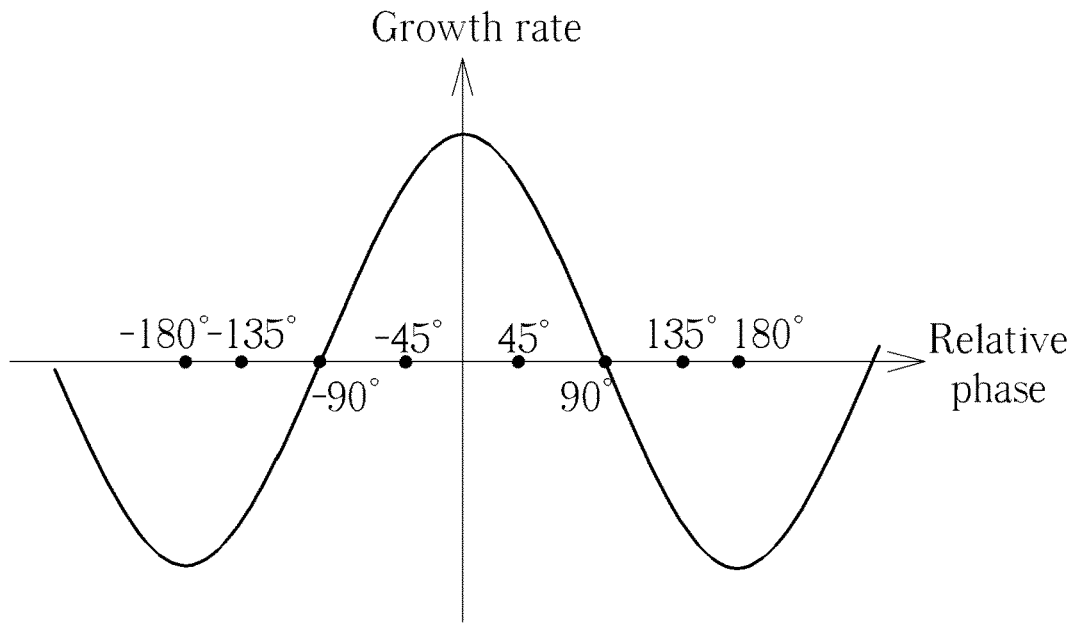
FIG. 5 illustrates a relationship between a growth rate of an intrinsic oscillation signal and relative phase according to an embodiment of the present invention.

FIG. 5 illustrates a relationship between a growth rate of the intrinsic oscillation signal and the relative phase according to an embodiment of the present invention. As show in FIG. 5, when the relative phase falls in an interval between +90 degrees (°) and −90 degrees, the growth rate of the intrinsic oscillation signal may be positive in response to the external clock injection; and when the relative phase falls outside this interval (e.g. the relative phase >+90° or the relative phase <−90°), the growth rate may be negative in response to the external clock injection, which means the low-Q oscillator may hinder the startup of the XO when the relative phase falls outside the interval between +90° and −90°.

Based on this, in the embodiment shown in FIG. 2, after the startup process of the XO 20 is enabled (e.g. after the injection switch is turned on), the injection switch is not turned off until the startup process is completed. Although the clock injection of the XO 20 is not interrupted for the lock/synchronization period required in the previous embodiment, the information related to the relative phase can be extracted from the signal $V_{GATE}$ according to the distortions, for controlling the injection frequency. In addition, the frequency controller 300 can utilize a control mechanism to ensure the relative phase always falls in the interval between +90° and −90°, and thereby prevent the startup process from being hindered by the injected signal. Thus, efficiency of clock injection is improved, and the startup time can be greatly reduced.

Figure 6:
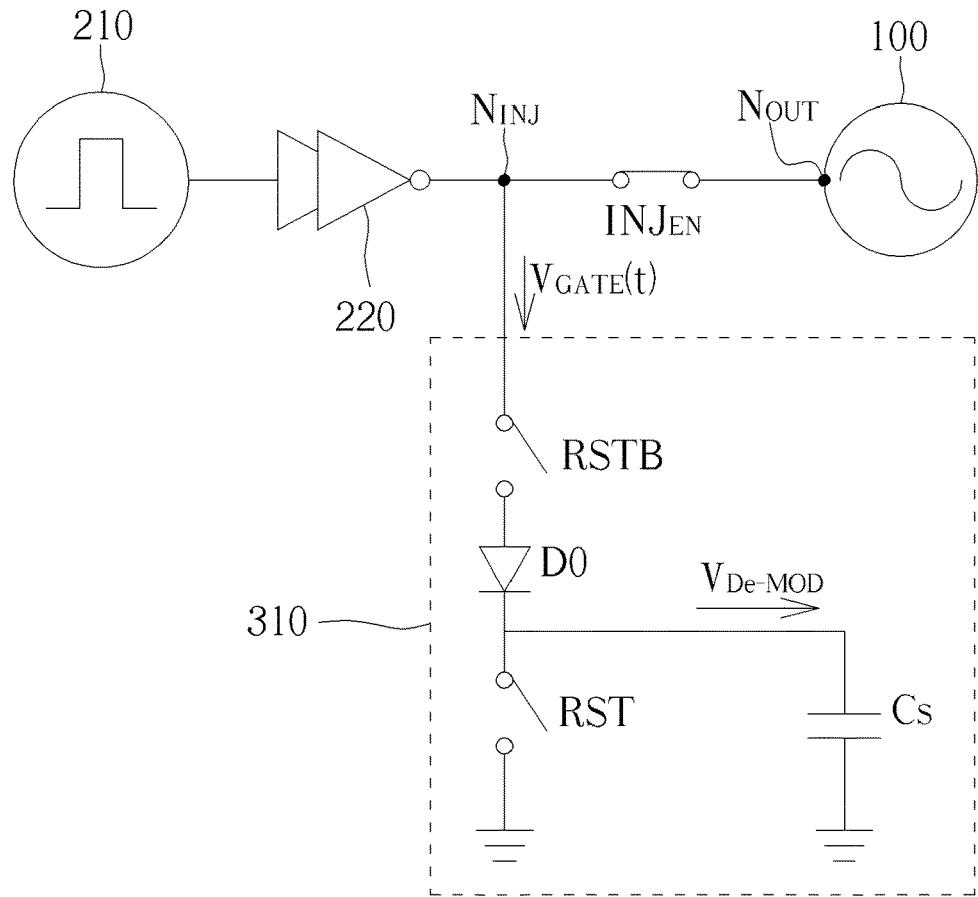
FIG. 6 is a diagram illustrating detailed implementation of generating a sequence of demodulated voltages by a demodulation circuit according to an embodiment of the present invention.

In one embodiment, the frequency controller 300 shown in FIG. 2 may comprise a demodulation circuit, where the demodulation circuit may be configured to receive the AM signal and generate a sequence of demodulated voltages according to the AM signal. FIG. 6 is a diagram illustrating detailed implementation of generating the sequence of demodulated voltages by a demodulation circuit 310 according to an embodiment of the present invention, where the demodulation circuit 310 may be an example of the aforementioned demodulation circuit. In this embodiment, the external oscillator 200 shown in FIG. 2 may comprise a low-Q oscillator 210 (e.g. a ring oscillator or an RC oscillator) and at least one output buffer (e.g. one or more output buffers, which are collectively referred to as an output buffer 220) shown in FIG. 6, where the buffer 220 may be coupled between the low-Q oscillator 210 and the injection node $N_{INJ}$. In some embodiments, the buffer 220 may be omitted.

In this embodiment, the demodulation circuit 310 may be implemented by using a diode with sample and hold mechanism as shown in FIG. 6, to extract the information related to the relative phase (e.g. the beating envelopes) from the AM signal such as the signal $V_{GATE}(t)$. In detail, the demodulation circuit 310 may comprise a diode D0, a reset switch controlled by a signal RST, a sampling switch controlled by a signal RSTB and a sampling capacitor $C_S$, where a cathode of the diode D0 is coupled to a sampling node of the demodulation circuit 310, the reset switch is coupled between the sampling node and a reference terminal (e.g. a ground voltage terminal) of the demodulation circuit 310, the sampling switch is coupled between an anode of the diode D0 and the injection node $N_{INJ}$ (or coupled between the anode of the diode D0 and the output terminal $N_{OUT}$ of the XO core circuit 100 in other embodiments), and the sampling capacitor $C_S$ is coupled between the sampling node and the reference terminal. For example, when the reset switch is turned on and the sampling switch is turned off during a reset period of the demodulation circuit 310, a voltage level of the sampling node is reset to a reference level of the reference terminal; and when the reset switch is turned off and the sampling switch is turned on during a sampling period, charges are accumulated on the sampling node in response to a voltage level of the AM signal exceeding a threshold corresponding to the diode D0 (e.g. in response to the voltage level of the signal $V_{GATE}(t)$ making a voltage difference between the cathode and the anode of the diode D0 greater than a threshold voltage of the diode D0), to generate a demodulated voltage of the sequence of demodulated voltages on the sampling node. The operations of the demodulation circuit 310 is similar to an integrator, so information related to the distortions may correspond to the sequence of demodulated voltages, where the sequence of demodulated voltages may be represented by a signal $V_{De-MOD}$. Note that each demodulated voltage of the sequence of demodulated voltages is generated through the same diode (i.e. the diode D0), and no mismatch issue is introduced among the sequence of demodulated voltages.

Figure 7:
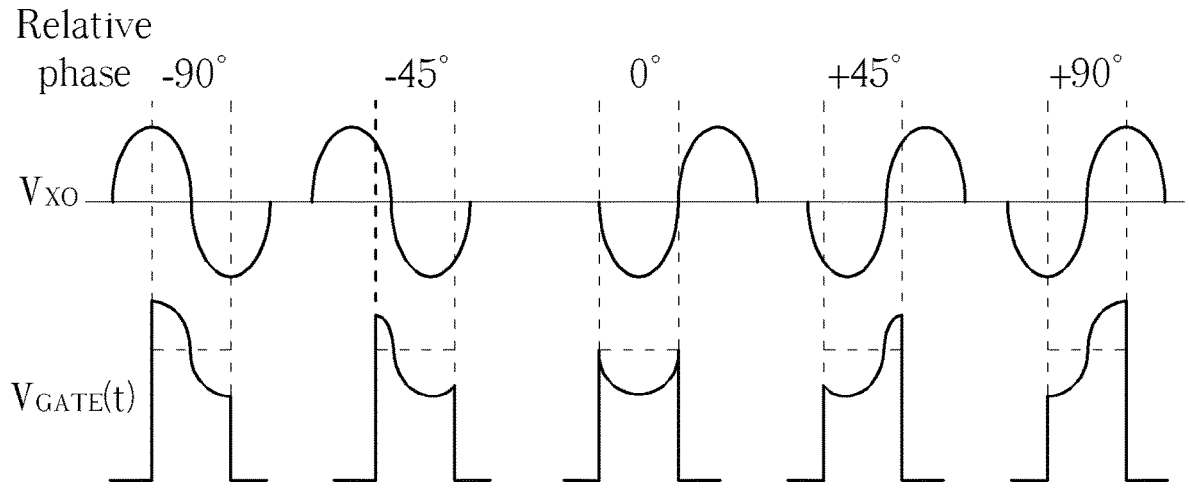
FIG. 7 illustrates some details of a relationship between relative phase and distortions according to an embodiment of the present invention.

FIG. 7 illustrates some details of a relationship between the relative phase and the distortions (e.g. the beating envelopes) according to an embodiment of the present invention. For better comprehension, assume that the energy of the intrinsic oscillation signal such as a signal $V_{XO}$ (e.g. amplitude of the signal $V_{XO}$) is unchanged. The beating envelopes with different relative phase ∅ may be calculated as follows:

$$Env0(\phi) = -\int_0^\pi A_0 \sin(\theta + \phi) d\theta = -2A_0 \cos(\phi)$$

Figure 8:
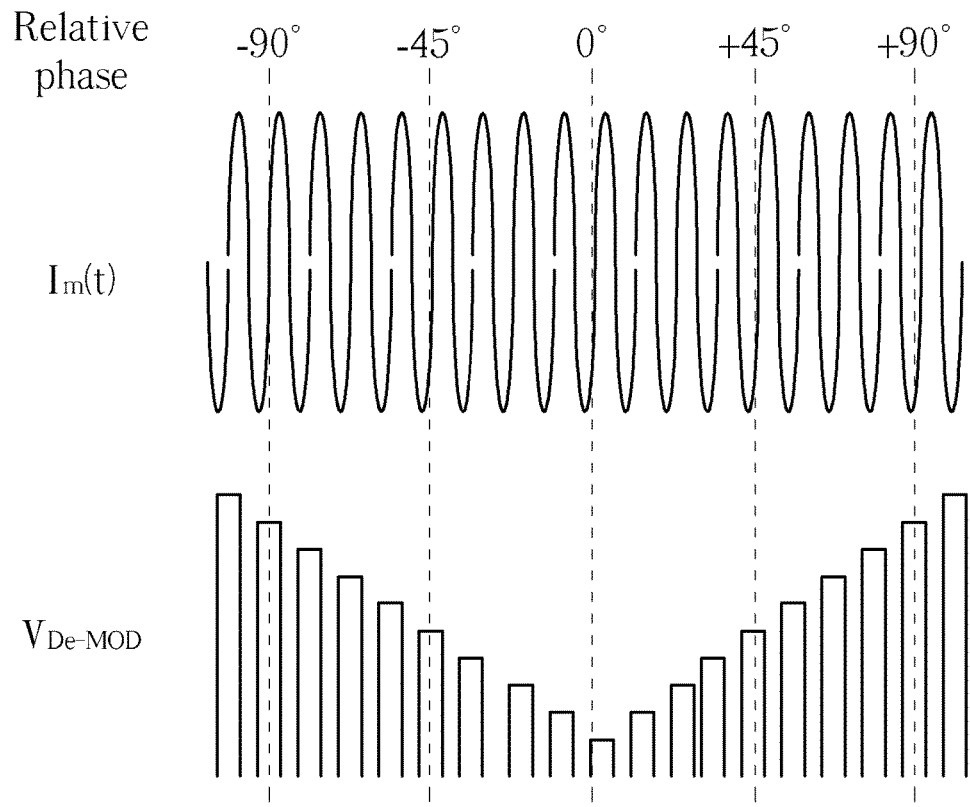
FIG. 8 illustrates some details of a relationship between relative phase and demodulated voltages according to an embodiment of the present invention.

According to this equation, the beating envelopes which is represented by Env1(∅) may be 0, $-\sqrt{2}A_0$, $-\sqrt{2}A_0$, $-\sqrt{2}A_0$, and ∅ when 0 is −90°, −45°, 0°, +45° and +90°, respectively, where $A_0$ may represent amplitude of the signal $V_{XO}$. Based on this, a relative phase $∅_{min}$ that results in a minimized beating envelope Env1(∅) may be 0°. Thus, the sequence of demodulated voltages such as the signal $V_{De-MOD}$ may have a minimum voltage when the relative phase $∅=∅_{min}=0°$ as shown in FIG. 8.

Figure 9:
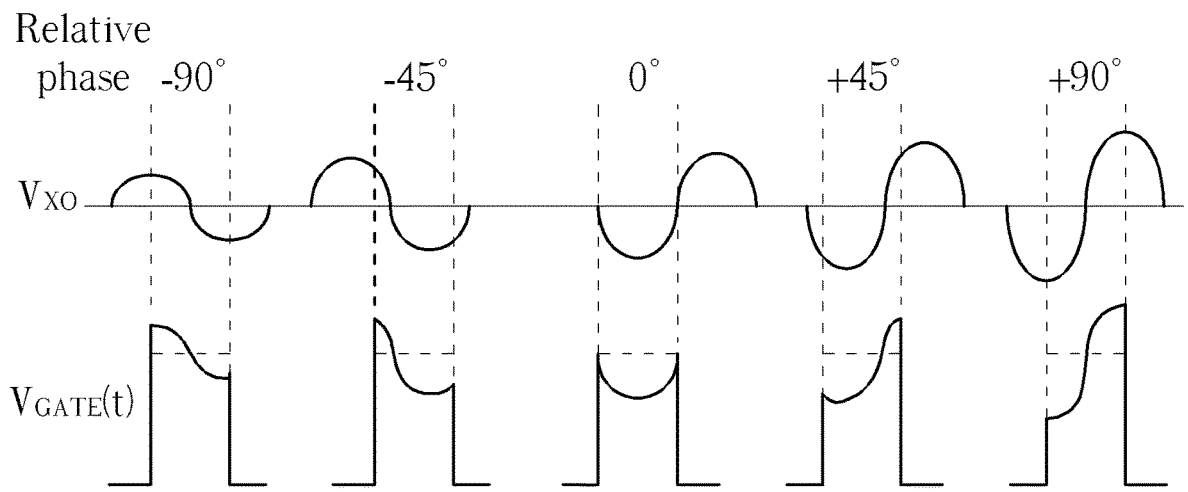
FIG. 9 illustrates some details of a relationship between relative phase and distortions according to an embodiment of the present invention.

In practice, the energy of the intrinsic oscillation signal such as the signal $V_{XO}$ (e.g. amplitude of the signal $V_{XO}$) may grow over time as shown in FIG. 9. The beating envelopes with different relative phase ∅ may be modified as follows:

$$Env1(\phi) = -\int_0^\pi (A_0 + k\phi)\sin(\theta + \phi) d\phi = -2(A_0 + k\phi)\cos(\phi)$$

Figure 10:
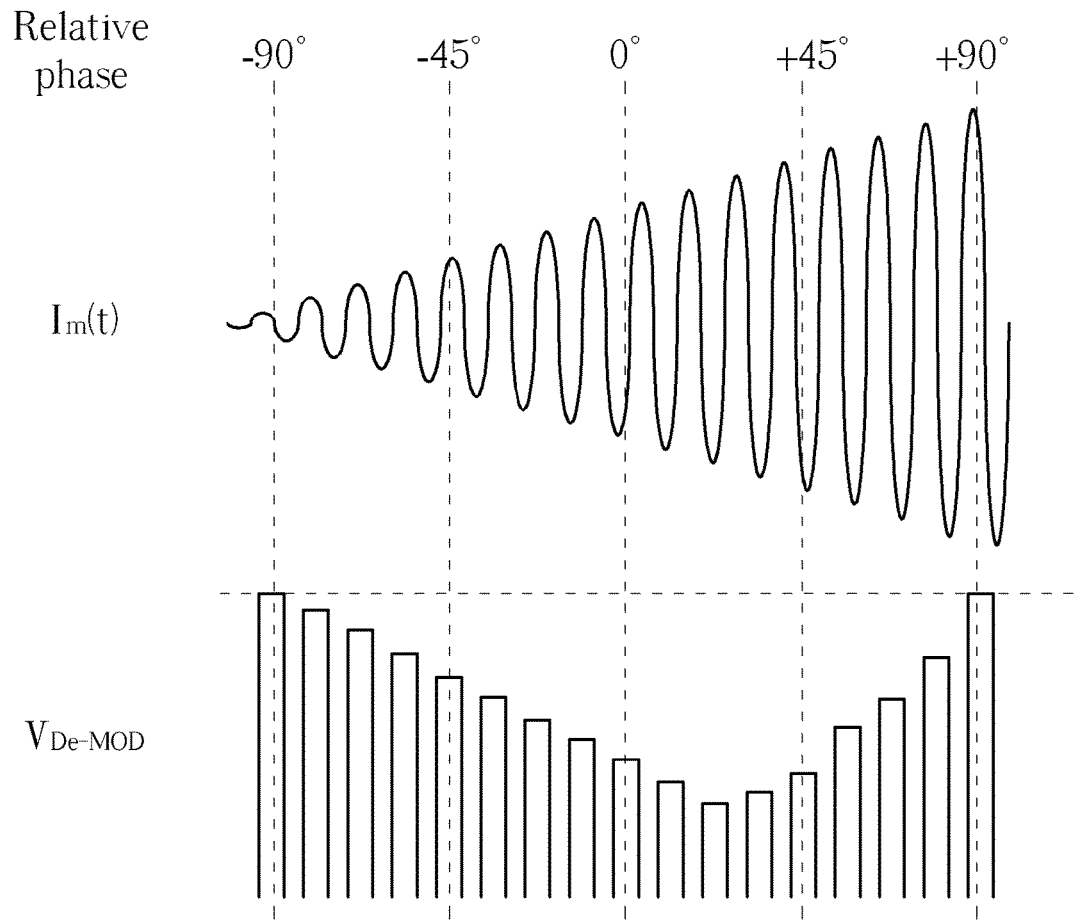
FIG. 10 illustrates some details of a relationship between relative phase and demodulated voltages according to an embodiment of the present invention.

The beating envelopes with growing amplitude of the signal $V_{XO}$ may be represented by Env1(∅). According to this equation, the beating envelopes Env1(∅) may be 0, $-\sqrt{2}[A_0+k∅]$, $-2[A_0+k∅]$, $-\sqrt{2}[A_0+k∅]$, and 0 when ∅ is −90°, −45°, 0°, +45° and +90°, respectively, where k may represent a growth rate of the amplitude of the signal $V_{XO}$. Based on this, when the relative phase ∅ accumulates in a positive direction, the relative phase $∅_{min}$ that results in a minimized beating envelope Env1(∅) may fall in an interval between 0° and 90° when $A_0$ and k are positive values. Thus, the sequence of demodulated voltages such as the signal $V_{De-MOD}$ may have a minimum voltage when $∅=∅_{min}$ as shown in FIG. 10. Similarly, when the relative phase ∅ accumulates in a negative direction, the relative phase $∅_{min}$ that results in a minimized beating envelope Env1(∅) may fall in an interval between 0° and −90° when $A_0$ and k are positive values. According to the above descriptions, it can be known that a relative phase between the injected signal and the intrinsic oscillation signal, which results that a minimum voltage (more particularly, a local minimum voltage) within the sequence of demodulated voltages shows up, falls in an interval between +90° and −90°.

Figure 11:
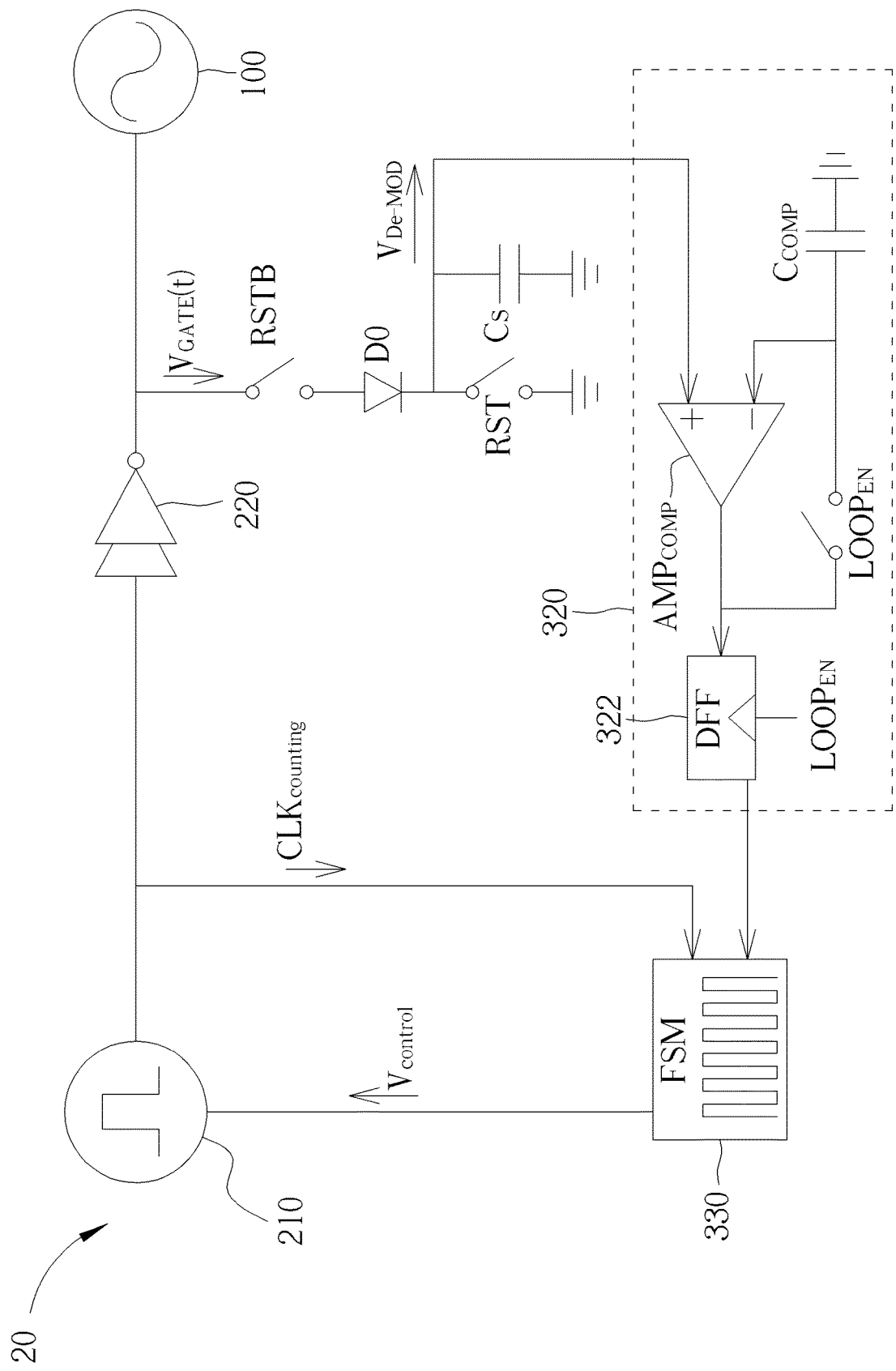
FIG. 11 is a diagram illustrating a detailed implementation of the XO shown in FIG. 2 according to an embodiment of the present invention.

FIG. 11 is a diagram illustrating a detailed implementation of the XO 20 according to an embodiment of the present invention. Note that the injection switch is turned on during the startup process, and is omitted in FIG. 11 for brevity. In addition to the demodulation circuit 310 shown in FIG. 6, the frequency controller 300 shown in FIG. 3 may further comprise a monitoring circuit 320 coupled to the demodulation circuit, and a finite state machine (FSM) 330 (an FSM with counter) coupled to the monitoring circuit 320 and the external oscillator 200 (e.g. the low-Q oscillator 210). In this embodiment, the FSM 330 may utilize the injected signal to be a counting clock (e.g. $CLK_{counting}$) for the FSM, but the present invention is not limited thereto. In this embodiment, the monitoring circuit 320 may be configured to generate a monitored result according to the sequence of demodulated voltages, and the FSM 330 may be configured to control the external oscillator 200 (e.g. the low-Q oscillator 210) through a signal $V_{control}$ to selectively change the injection frequency according to the monitored result, to ensure the relative phase falls in an interval between +90 degrees and −90 degrees. In the embodiment of FIG. 11, the monitoring circuit 320 may comprise an amplifier $AMP_{COMP}$, a capacitor $C_{COMP}$ and a loop switch controlled by a signal $LOOP_{EN}$, where a first input terminal (which is labeled "+" on the amplifier $AMP_{COMP}$ shown in FIG. 11) of the amplifier $AMP_{COMP}$ may be coupled to the demodulation circuit 310 (e.g. the sampling node therein), the capacitor $C_{COMP}$ may be coupled between a reference terminal and a second input terminal (which is labeled "−" on the amplifier $AMP_{COMP}$ shown in FIG. 11) of the amplifier $AMP_{COMP}$, and the loop switch may be coupled between the second input terminal and an output terminal of the amplifier $AMP_{COMP}$. In this embodiment, a D flip-flop (DFF) 322 controlled by the signal $LOOP_{EN}$ may be included in the monitoring circuit 320, where the DFF is coupled between the output terminal of the amplifier $AMP_{COMP}$ and the FSM 330 to make the FSM 330 receives digital results only, but the present invention is not limited thereto.

Figure 12:
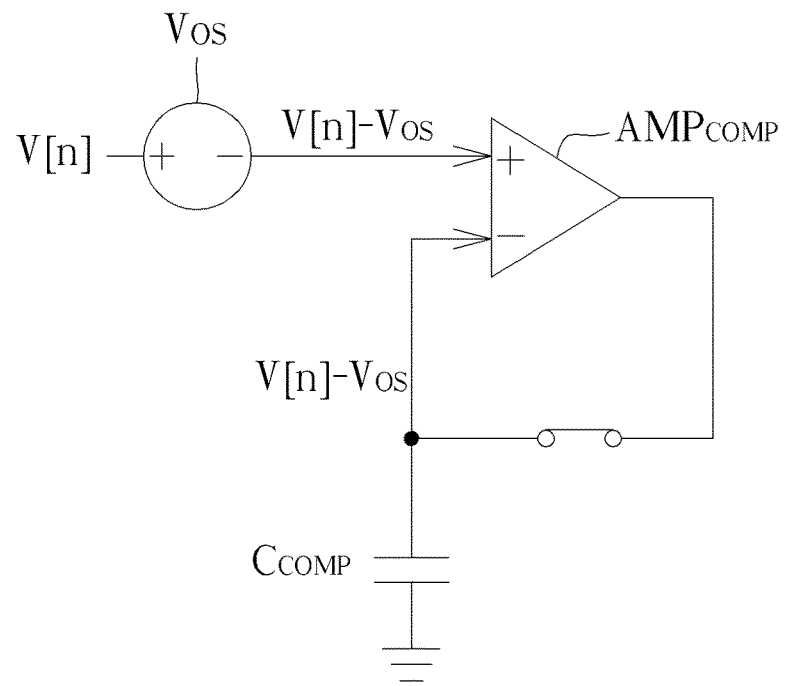
FIG. 12 illustrates operations of a monitoring circuit shown in FIG. 11 during a preset phase.
Figure 13:
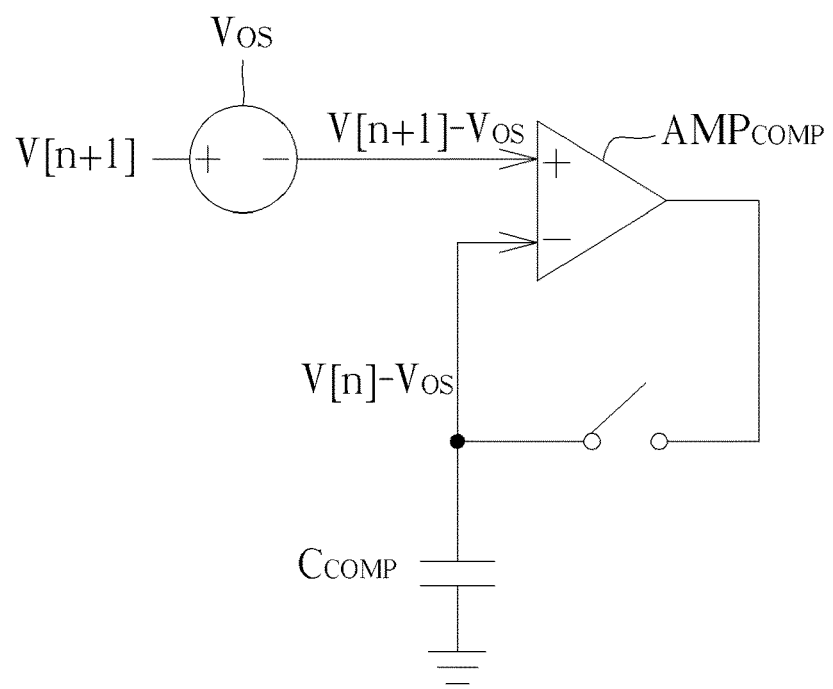
FIG. 13 illustrates operations of the monitoring circuit shown in FIG. 11 during an evaluation phase.

In detail, the amplifier $AMP_{COMP}$ may be configured to receive the sequence of demodulated voltages through the first input terminal thereof, the capacitor $C_{COMP}$ may be configured to sequentially store the sequence of demodulated voltages, and the loop switch is configured to control configurations of the monitoring circuit 320. For better comprehension, please refer to FIGS. 12 and 13, where FIG. 12 illustrates operations of the monitoring circuit 320 shown in FIG. 11 during a preset phase, and FIG. 13 illustrates operations of the monitoring circuit 320 shown in FIG. 11 during an evaluation phase. During the preset phase of the monitoring circuit 320, the loop switch is turned on, the monitoring circuit 320 is configured as a unit gain buffer to transmit a first demodulated voltage within the sequence of demodulated voltages from the first input terminal of the amplifier $AMP_{COMP}$ to the capacitor $C_{COMP}$ (e.g. the second input terminal of the amplifier $AMP_{COMP}$). During the evaluation phase, the loop switch is turned off, the monitoring circuit 320 is configured as a comparator to compare the second demodulated voltage on the first input terminal of the amplifier $AMP_{COMP}$ with the first demodulated voltage stored on the capacitor (on the second input terminal of the amplifier $AMP_{COMP}$), and accordingly generates a comparison result, wherein the monitored result comprises the comparison result. Deduced by analogy, consecutive comparison results of the sequence of demodulated voltages may be generated, where these consecutive comparison results may represent the monitored result.

Assume that a comparison result "0" of the monitoring circuit 320 indicates that a previous demodulated voltage of two consecutive demodulated voltages within the sequence of demodulated voltages (e.g. the aforementioned first demodulated voltage) is greater than a later demodulated voltage of these two consecutive demodulated voltages within the sequence of demodulated voltages (e.g. the aforementioned first demodulated voltage), and a comparison result "1" of the monitoring circuit 320 indicates that the previous demodulated voltage of these two consecutive demodulated voltages is less than the later demodulated voltage. Thus, when the comparison result changes from "0" to "1", it means that the local minimum of the sequence of demodulated voltages is detected.

In practice, an intrinsic offset $V_{OS}$ caused by mismatch of the first input terminal and the second input terminal of the amplifier $AMP_{COMP}$ may exist. Based on the operations shown in FIG. 12 and FIG. 13, impact from the intrinsic offset $V_{OS}$ may be removed from the comparison result. For example, when the first demodulated voltage (which may be represented by "V[n]") is transmitted to the second input terminal of the amplifier $AMP_{COMP}$ from the first input terminal of the amplifier $AMP_{COMP}$ during the preset phase, the intrinsic offset $V_{OS}$ can be stored on the capacitor $C_{COMP}$ in conjunction with the first voltage, so the capacitor $C_{COMP}$ may store a voltage $V[n]-V_{OS}$; and during the evaluation phase, the second demodulated voltage (which may be represented by V[n+1]) may exist on the first terminal of the amplifier $AMP_{COMP}$ in conjunction with the intrinsic offset $V_{OS}$. As both the first input terminal and the second input terminal of the amplifier $AMP_{COMP}$ have the intrinsic offset thereon, the comparison result (e.g. $AD_{RESULT}$ shown in FIG. 13) will not be affected by the intrinsic offset.

It should be noted that the monitoring circuit 320 is not limited to being used in the XO 20 shown in 11. Any system that required consecutive comparison operations (e.g. generate a comparison result regarding adjacent data (or voltages) within a sequence of data (or voltages)) may be implemented by the monitoring circuit 320.

Figure 14:
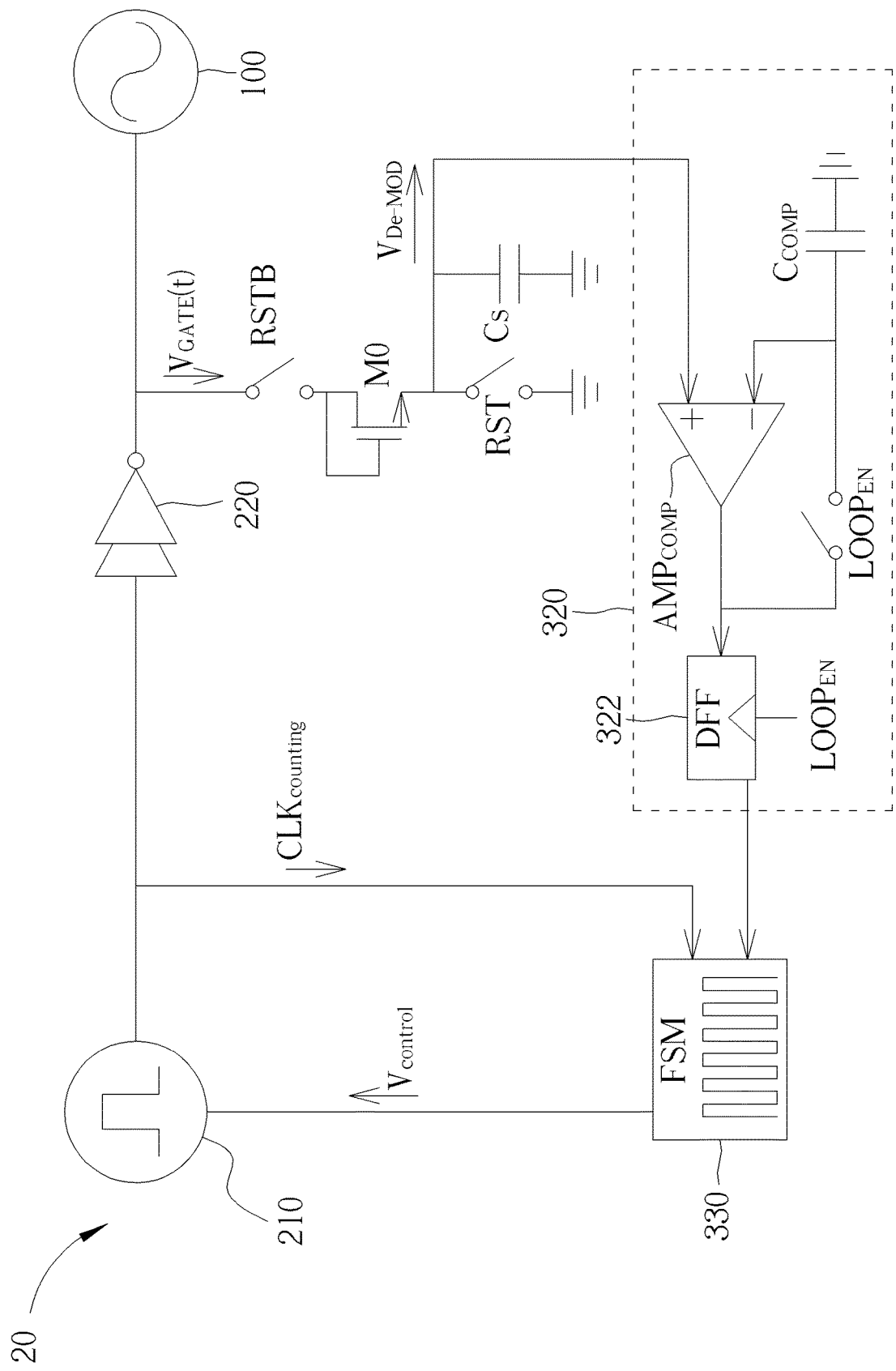
FIG. 14 is a diagram illustrating a detailed implementation of the XO shown in FIG. 2 according to an embodiment of the present invention.

In another embodiments, the diode D0 within the demodulation circuit 310 may be replaced with a transistor M0 (e.g. an N-type transistor) as shown in FIG. 14, where a gate terminal of the transistor M0 is coupled to the drain terminal of the transistor M0, to make the transistor act like a diode, but the present invention is not limited thereto. Note that the injection switch is turned on during the startup process, and is omitted in FIG. 11 for brevity.

Figure 15:
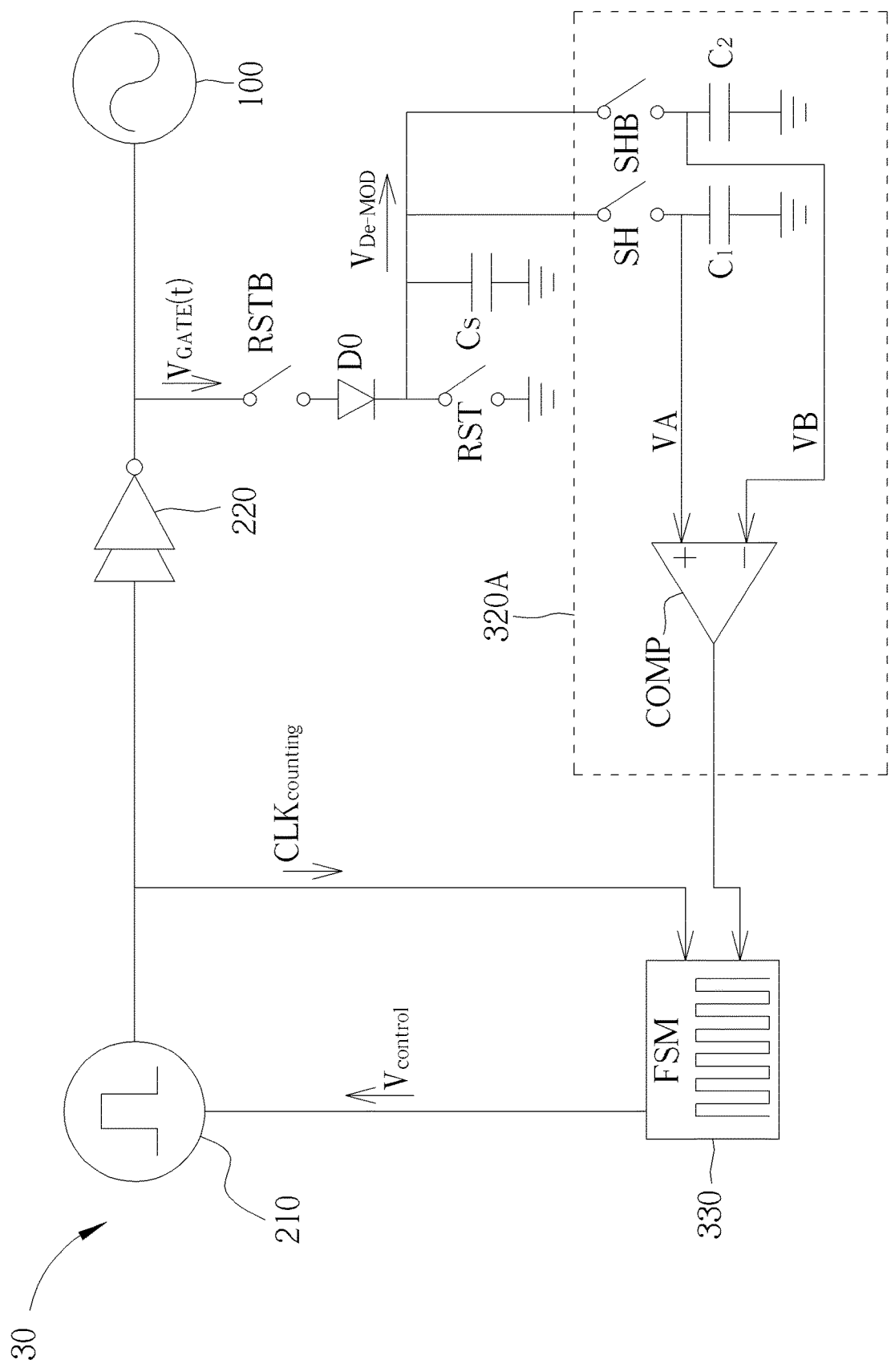
FIG. 15 is a diagram illustrating a detailed implementation of the XO shown in FIG. 2 according to another embodiment of the present invention.

In another embodiment, the monitoring circuit 320 may be replaced with a monitoring circuit 320A as illustrated by an XO 30 shown in FIG. 15, where the monitoring circuit 320A may comprise a comparator COMP, a first sampling switch controlled by a signal SH, a second sampling switch controlled by a signal SHB, a first sampling capacitor $C_1$ and a second sampling capacitor $C_2$. Note that the injection switch is turned on during the startup process, and is omitted in FIG. 11 for brevity. As shown in FIG. 15, the first sampling switch and the first sampling capacitor $C_1$ forms a first sample and hold circuit coupled to a first input terminal (which labeled "+" on the comparator COMP) of the comparator COMP, and the second sampling switch and the second sampling capacitor $C_2$ forms a second sample and hold circuit coupled to a second input terminal (which labeled "+" on the comparator COMP) of the comparator COMP, where signals VA and VB represent voltage on the first input terminal and the second input terminal of the comparator COMP.

Figure 16:
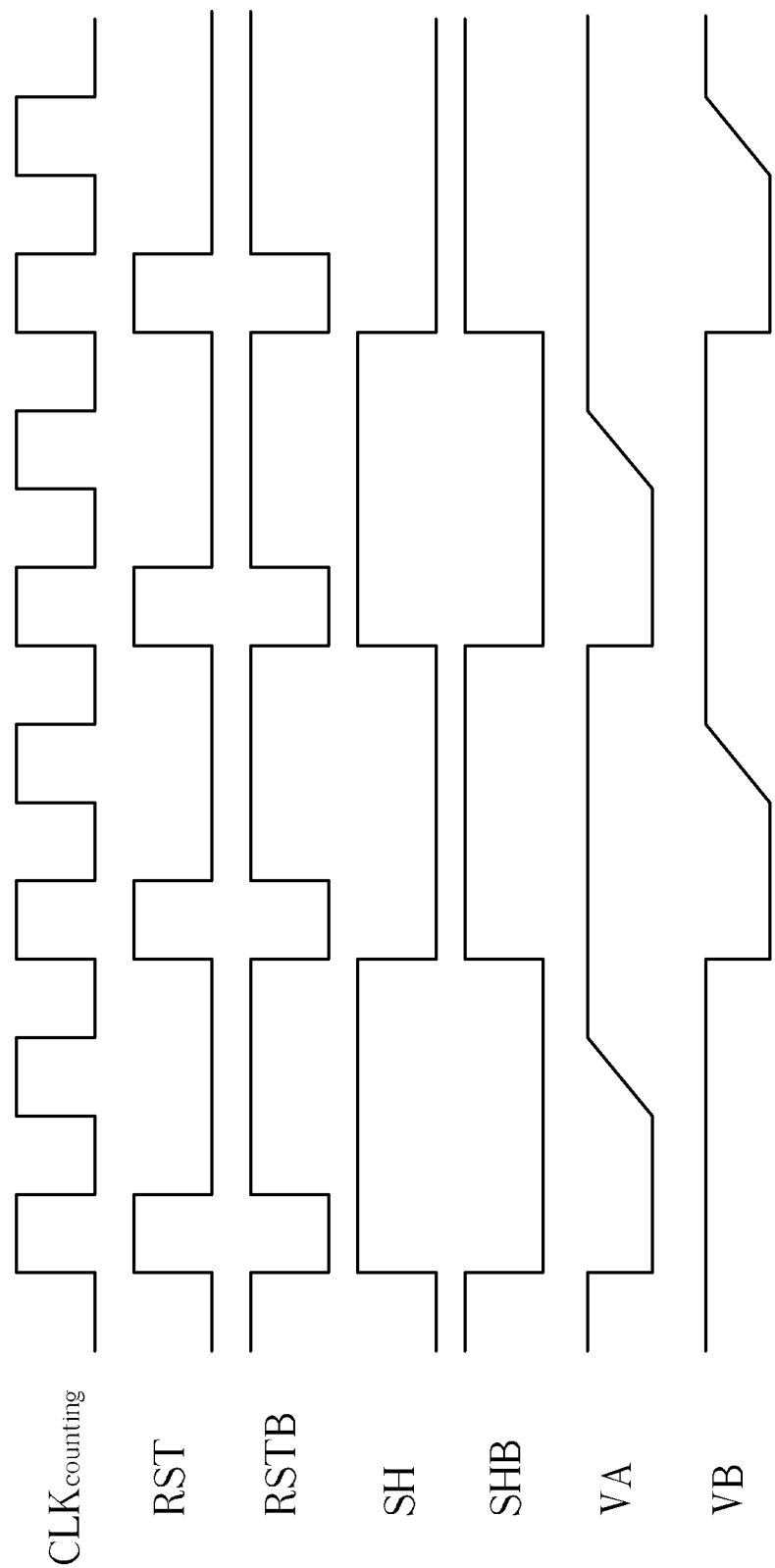
FIG. 16 is a timing diagram illustrating some signals within the implementation shown in FIG. 15 according to an embodiment of the present invention.

FIG. 16 is a timing diagram illustrating some signals (e.g. the counting clock $CLK_{counting}$, the signals RST, RSTB, SH, SHB, and the signals VA and VB) within the XO 20 shown in FIG. 15 according to an embodiment of the present invention. In this embodiment, the signals RST, RSTB, SH and SHB may be generated by a timing controller (not shown) according to the counting clock $CLK_{counting}$, but the present invention is not limited thereto. According to the timing shown in FIG. 16, each of the sequence of demodulated voltages may be sampled on either the sampling capacitor $C_1$ or $C_2$ by turns, and corresponding monitored result of the sequence of demodulated voltages may be output from the comparator COMP.

Figure 17:
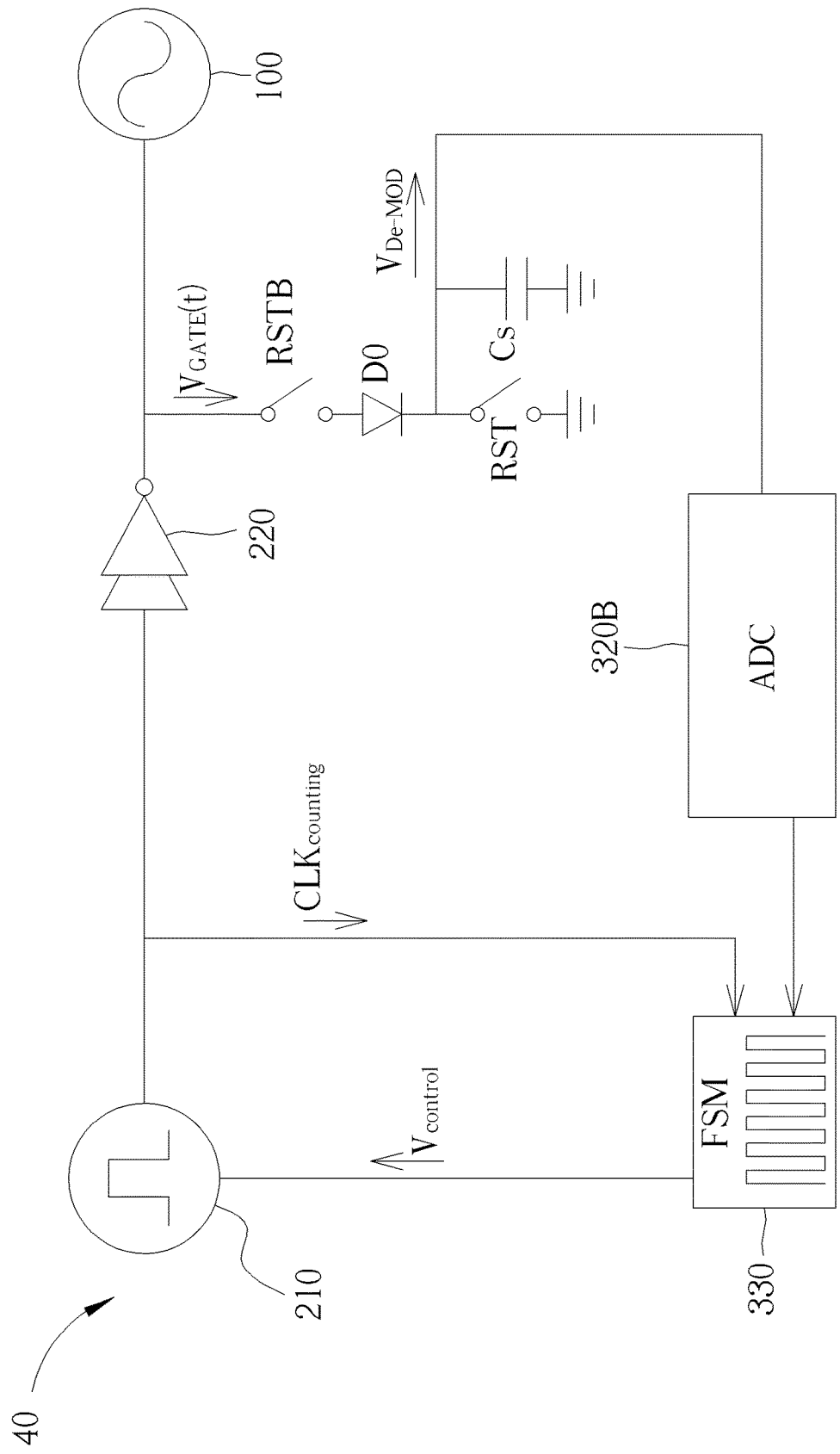
FIG. 17 is a diagram illustrating a detailed implementation of the XO shown in FIG. 2 according to another embodiment of the present invention.

In another embodiment, the monitoring circuit 320 may be replaced with an analog-to-digital converter (ADC) 320B as illustrated by an XO 40 shown in FIG. 17. Note that the injection switch is turned on during the startup process, and is omitted in FIG. 11 for brevity. For example, the ADC 320B may sequentially convert the sequence of demodulated voltages into digital codes, where these digital codes may represent the aforementioned monitored result, and the FSM 330 may control the low-Q oscillator 210 to selectively change the injection frequency according to these digital codes.

Figure 18:
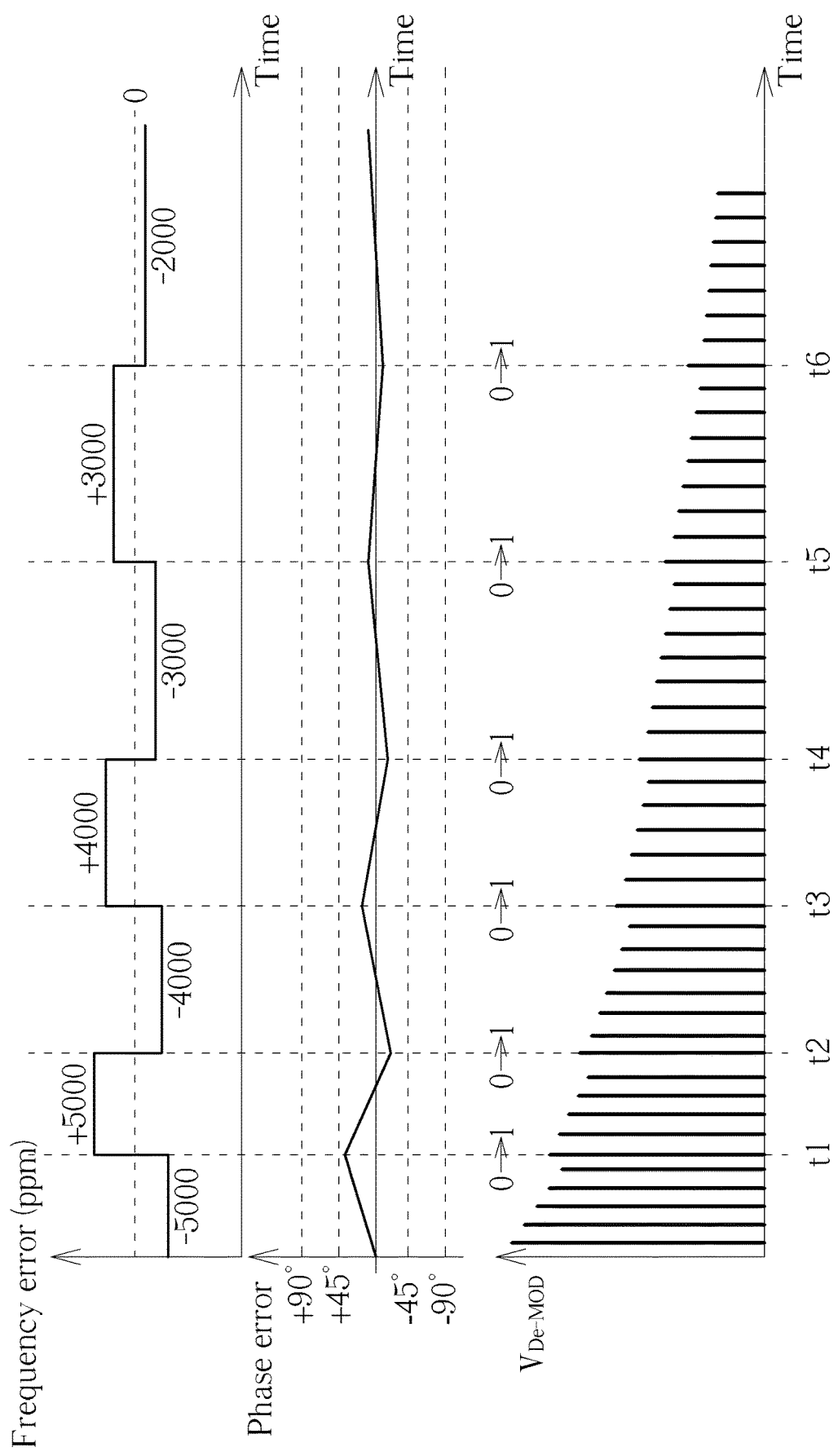
FIG. 18 illustrates some details related to control of an injection frequency according to an embodiment of the present invention.

FIG. 18 illustrates some details related to control of the injection frequency according to an embodiment of the present invention. As shown in FIG. 18, the FSM 330 may control the external oscillator (e.g. the low-Q oscillator 210) to iteratively switch the injection frequency to one or more target frequency among multiple candidate frequencies according to the monitored result, to make the injection frequency stepwise approach the intrinsic frequency of the intrinsic oscillation signal, wherein the multiple candidate frequencies corresponds to multiple states of the FSM 330, respectively. In this embodiment, it is assumed that the intrinsic frequency (which may be regarded as a target frequency) is equal to a center frequency among the multiple candidate frequencies (e.g. having 0 ppm frequency error relative to the center frequency). When the injection frequency is initially at a first frequency, which has −5000 ppm frequency error relative to the center frequency among the multiple candidate frequencies, the relative phase (e.g. phase error) between the intrinsic oscillation signal and the injected signal may start accumulating in the positive direction, where the energy of the intrinsic oscillation signal is increasing, and levels of the sequence of demodulated voltage such as the signal $V_{De\text{-}MOD}$ is decreasing, so the comparison result from the monitoring circuit 320 is kept at "0" at the beginning. When the monitored result indicates that a later demodulated voltage is greater than a previous demodulated voltage at a time point t1 (e.g. the comparison result from the monitoring circuit 320 changes from "0" to "1"), it means a local minimum voltage of the sequence of demodulated voltages (e.g. the signal $V_{De\text{-}MOD}$) is detected, where the FSM 330 may determine that candidate frequencies less than the first frequency is not available, and control the external oscillator 200 (e.g. the low-Q oscillator) to switch the injection frequency from the first frequency to a second frequency which has +5000 ppm frequency error relative to the center frequency, and then the comparison result returns to "0". Similarly, when the monitored result indicates that the comparison result changes from "0" to "1" at a time point t2, the FSM 330 may determine that candidate frequencies greater than the second frequency is not available, and control the external oscillator 200 (e.g. the low-Q oscillator) to switch the injection frequency from the second frequency to a third frequency which has −4000 ppm frequency error relative to the center frequency. Deduced by analogy, the injection frequency may be switched to a fourth frequency, a fifth frequency, a sixth frequency and a seventh frequency at time points t3, t4, t5 and t6, respectively. Similar descriptions are not repeated here for brevity. According to this, whenever a demodulated voltage within the sequence of the demodulated voltages reaches a minimum, the injection frequency can be adjusted properly, such that the relative phase may accumulate in alternating directions, and thereby ensure that the relative phase is confined within ±90° (typically, within ±40° or less), so the energy of the intrinsic oscillation signal always increases.

Figure 19:
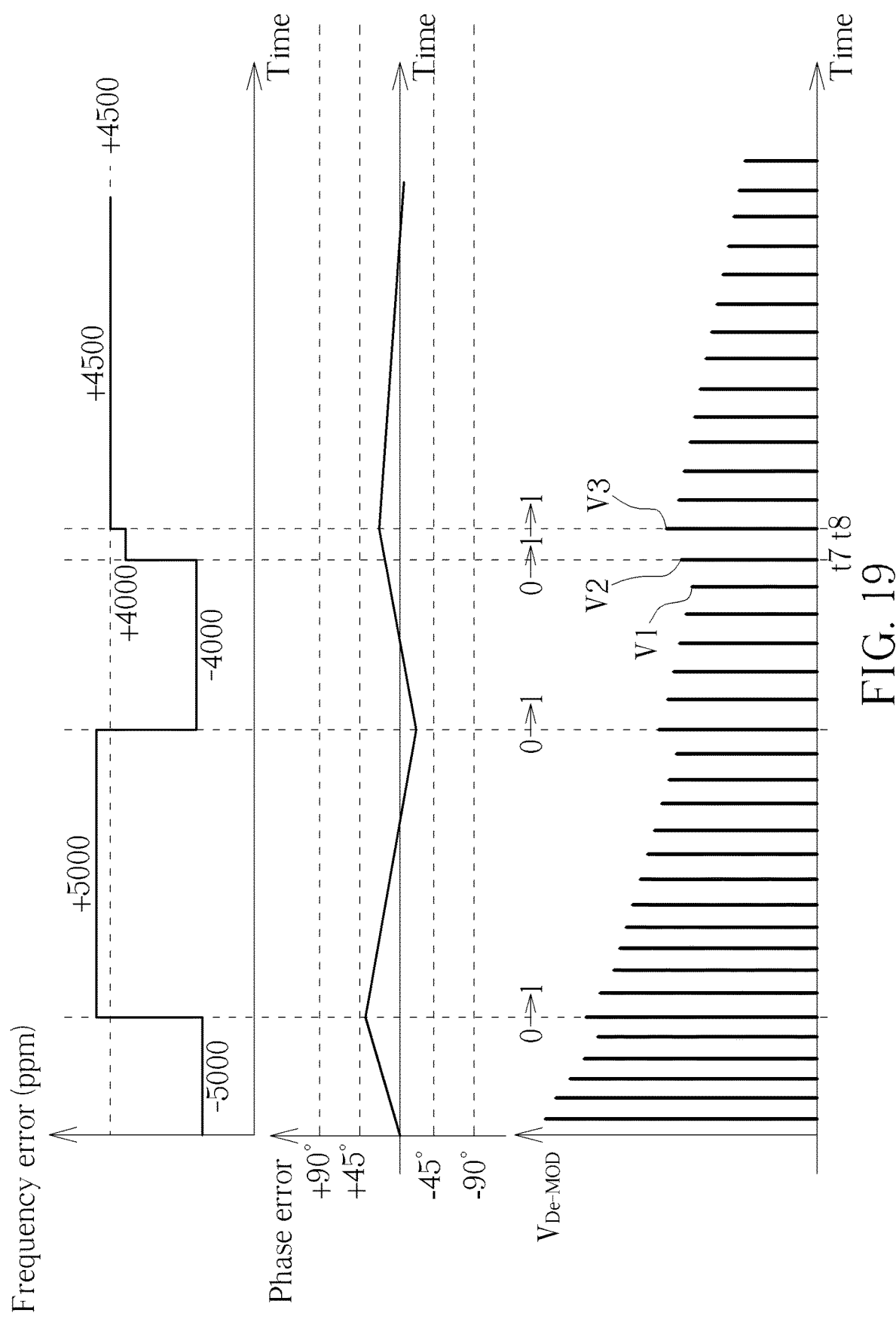
FIG. 19 illustrates some details related to control of an injection frequency according to another embodiment of the present invention.

FIG. 19 illustrates some details related to control of the injection frequency according to another embodiment of the present invention. In this embodiment, it is assumed that the intrinsic frequency (which may be regarded as a target frequency) has +4500 ppm frequency error relative to the center frequency. As shown in FIG. 19, the monitored result indicates that the comparison result changes from "0" to "1" at a time point t7 (i.e. a demodulated voltage V1 is greater than a demodulated voltage V2), the FSM 330 may determine that candidate frequencies less than the third frequency (which has −4000 ppm frequency error) is not available, and control the external oscillator 200 (e.g. the low-Q oscillator) to switch the injection frequency from the third frequency to the fourth frequency which has +4000 ppm frequency error relative to the center frequency. However, the comparison result is still kept at "1" at a time point t8 as a demodulated voltage V3 is greater than the demodulated voltage V2, which means that the switching from the third frequency to the fourth frequency is unable to change the accumulating direction of the relative phase. Thus, the FSM 330 may control the external oscillator 200 (e.g. the low-Q oscillator) to further switch the injection frequency from the fourth frequency to an eighth frequency (which has +4500 ppm frequency error) greater than the fourth frequency (which has +4000 ppm frequency error) in order to change the accumulating direction of the relative phase. Similarly, if the comparison result is still kept at "1" after the injection frequency is switched from a ninth frequency to a tenth frequency less than the ninth frequency, the FSM 330 may control the external oscillator 200 (e.g. the low-Q oscillator) to further switch the injection frequency from the tenth frequency to an eleventh frequency less than the tenth frequency.

In some embodiments, the FSM 330 may control the external oscillator 200 (e.g. the low-Q oscillator 210) to iteratively switch the injection frequency to either a first candidate frequency (e.g. the first frequency having −5000 ppm frequency error) or a second candidate frequency (e.g. the second frequency having +5000 ppm frequency error) according to the monitored result. Note that the first frequency is greater than the intrinsic frequency of the intrinsic oscillation signal, and the second frequency is less than the intrinsic frequency, so each switching between the first candidate frequency and the second candidate frequency is indeed able to change the accumulating direction of the relative phase. Thus, the relative phase still can be confined within ±90°, and it can be ensured that the energy of the intrinsic oscillation signal always increase during the startup process with aid of two candidate frequencies only.

In some embodiments, the injection switch may be turned on for a predetermined time period. That is, the time point to turn off the injection switch (or the timing to finish the startup process) may be determined in advance. In other embodiment, the system comprising the XO 20 may monitor at least one signal within the XO 20, to trigger the system to finish the startup process (e.g. turn off the injection switch) in response to the aforementioned at least one signal satisfying a specific condition. In one embodiment, assuming that an initial demodulated voltage represents a first demodulated voltage of the sequence of demodulated voltages at the beginning of the startup process, when a target demodulated voltage of the sequence of demodulated voltages is detected, the system may determine that the startup process is completed, and the injection switch may be turned off, wherein a voltage difference between the target demodulated voltage and the initial demodulated voltage is greater than or equal to a predetermined value. Thus, when the energy of the intrinsic oscillation signal grows to a specific value which results in the target demodulated voltage showing up, the startup process may be regarded as completed, and the injection switch is therefore turned off.

The startup method and associated XO architecture provided by the embodiments of the present invention can control the switching of the injection frequency according to the distorted square wave caused by amplitude modulation of the injected signal and the intrinsic oscillation signal, to make the relative phase between the injected signal and the intrinsic oscillation signal confined within a desired interval (e.g. ±90°). Based on this, the injection switch does not need to be turned off for the aforementioned lock/synchronization period, and it is further ensured that the energy of the intrinsic oscillation signal always increases. Assume that a reference time period is required for the startup process when the injected frequency of the injected signal is identical to the intrinsic frequency of the XO core circuit. Regarding a method which temporarily interrupts the clock injection for the aforementioned lock/synchronization period, a 17.4 to 90.6 times the reference time period might be required for the startup process. Regarding the startup method which does not turn off the injection until the startup process is completed, a 1.05 to 1.5 times the reference time period may be required, which means the present invention indeed greatly enhance clock injection efficiency, and the startup time can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for startup of a crystal oscillator (XO) with aid of external clock injection, the method comprising:
   utilizing an external oscillator which is external to an XO core circuit of the XO to generate an injected signal, wherein the XO comprises the XO core circuit, the external oscillator positioned outside of the XO core circuit, and at least one injection switch, the at least one injection switch is coupled between an injection node of the XO and an output terminal of the XO core circuit, the external oscillator is coupled to the injection node, and a quality factor of the external oscillator is lower than a quality factor of the XO core circuit;
   turning on the at least one injection switch to make energy of the injected signal be injected into the XO core circuit, thereby increasing energy of an intrinsic oscillation signal of the XO core circuit, wherein a modulation signal is generated on the injection node according to combination of the injected signal and the intrinsic oscillation signal; and
   controlling the external oscillator to selectively change an injection frequency of the injected signal according to the modulation signal;
   wherein the at least one injection switch is turned on when the external oscillator selectively changes the injection frequency of the injected signal.

2. The method of claim 1, wherein the step of controlling the external oscillator to selectively change the injection frequency of the injected signal according to the modulation signal comprises:
   utilizing a demodulation circuit of the XO to generate a sequence of demodulated voltages according to the modulation signal, wherein the sequence of demodulated voltages carries information of relative phase between the injected signal and the intrinsic oscillation signal;
   utilizing a monitoring circuit of the XO to generate a monitored result according to the sequence of demodulated voltages; and
   controlling the external oscillator to selectively change the injection frequency according to the monitored result.

3. The method of claim 2, wherein the step of controlling the external oscillator to selectively change the injection frequency according to the monitored result comprises:
   iteratively switching the injection frequency to either a first frequency or a second frequency according to the monitored result to cause the relative phase falls in an interval between +90 degrees and −90 degrees, wherein the first frequency is greater than an intrinsic frequency of the intrinsic oscillation signal, and the second frequency is less than the intrinsic frequency.

4. The method of claim 2, wherein the step of controlling the external oscillator to selectively change the injection frequency according to the monitored result comprises:
   switching the injection frequency among multiple candidate frequencies according to the monitored result, to make the injection frequency approach an intrinsic frequency of the intrinsic oscillation signal, wherein the multiple candidate frequencies correspond to multiple states of a finite state machine (FSM), respectively.

5. The method of claim 2, wherein the sequence of demodulated voltages comprises a first demodulated voltage and a second demodulated voltage following the first demodulated voltage, and the step of controlling the external oscillator to selectively change the injection frequency according to the monitored result comprises:
   in response to the monitored result indicating that the second demodulated voltage is greater than the first demodulated voltage, switching the injection frequency from a first frequency to a second frequency.

6. The method of claim 5, wherein the sequence of demodulated voltages further comprises a third demodulated voltage following the second demodulated voltage, and the step of controlling the external oscillator to selectively change the injection frequency according to the monitored result further comprises:
   in response to the monitored result indicating that the third demodulated voltage is greater than the second demodulated voltage, switching the injection frequency from the second frequency to a third frequency;
   wherein the first frequency is greater than the second frequency, and the second frequency is greater than the third frequency; or the first frequency is less than the second frequency, and the second frequency is less than the third frequency.

7. The method of claim 2, wherein the sequence of demodulated voltages comprises a first demodulated voltage and a second demodulated voltage following the first demodulated voltage, the monitoring circuit comprises an amplifier and a capacitor, and the step of utilizing the monitoring circuit to generate the monitored result according to the sequence of demodulated voltages comprises:
   configuring the monitoring circuit as a unit gain buffer to transmit the first demodulated voltage from a first input terminal of the amplifier to a capacitor coupled to a second input terminal of the amplifier by turning on a loop switch coupled between the second input terminal and an output terminal of the amplifier; and
   configuring the monitoring circuit as a comparator to compare the second demodulated voltage on the first input terminal of the amplifier with the first demodulated voltage stored on the capacitor by turning off the loop switch, and accordingly generate a comparison result, wherein the monitored result comprises the comparison result.

8. The method of claim 2, wherein the step of utilizing the demodulation circuit to generate the sequence of demodulated voltages according to the modulation signal comprises:
   turning on a reset switch of the demodulation circuit and turning off a sampling switch of the demodulation circuit, to reset a voltage level of a sampling node of the demodulation circuit to a reference level during a reset period; and
   turning off the reset switch and turning on the sampling switch, to accumulate charges on the sampling node in response to a voltage level of the modulation signal exceeding a threshold corresponding to a diode of the demodulation circuit during a sampling period, to generate a demodulated voltage of the sequence of demodulated voltages on the sampling node.

9. The method of claim 2, wherein an initial demodulated voltage represents a first demodulated voltage of the sequence of demodulated voltages, and the method further comprises:

in response to a target demodulated voltage of the sequence of demodulated voltages being detected to indicate that the startup process is completed, turning off the at least one injection switch, wherein a voltage difference between the target demodulated voltage and the initial demodulated voltage is greater than or equal to a predetermined value.

10. A crystal oscillator (XO), comprising:

an XO core circuit, configured to generate an intrinsic oscillation signal;

an external oscillator, coupled to an injection node of the XO, configured to generate an injected signal, wherein a quality factor of the external oscillator is lower than a quality factor of the XO core circuit;

at least one injection switch, coupled between the injection node and an output terminal of the XO core circuit, wherein when the at least one injection switch is turned on, energy of the injected signal is injected into the XO core circuit to increase energy of the intrinsic oscillation signal, and a modulation signal is generated on the injection node according to combination of the injected signal and the intrinsic oscillation signal; and a frequency controller, coupled to the external oscillator, configured to control the external oscillator to selectively change an injection frequency of the injected signal according to the modulation signal;

wherein the at least one injection switch is turned on when the external oscillator selectively changes the injection frequency of the injected signal.

11. The XO of claim 10, wherein the frequency controller comprises:

a demodulation circuit, configured to receive the modulation signal and generate a sequence of demodulated voltages according to the modulation signal, wherein the sequence of demodulated voltages carries information of relative phase between the injected signal and the intrinsic oscillation signal;

a monitoring circuit, coupled to the demodulation circuit, configured to generate a monitored result according to the sequence of demodulated voltages; and a finite state machine (FSM), coupled to the monitored circuit and the external oscillator, configured to control the external oscillator to selectively change the injection frequency according to the monitored result.

12. The XO of claim 11, wherein the FSM controls the external oscillator to iteratively switch the injection frequency to either a first frequency or a second frequency according to the monitored result to cause the relative phase falls in an interval between +90 degrees and −90 degrees, wherein the first frequency is greater than an intrinsic frequency of the intrinsic oscillation signal, and the second frequency is less than the intrinsic frequency.

13. The XO of claim 11, wherein the FSM controls the external oscillator to switch the injection frequency among multiple candidate frequencies according to the monitored result, to make the injection frequency approach an intrinsic frequency of the intrinsic oscillation signal, wherein the multiple candidate frequencies corresponds to multiple states of the FSM, respectively.

14. The XO of claim 11, wherein the sequence of demodulated voltages comprises a first demodulated voltage and a second demodulated voltage following the first demodulated voltage; and when the monitored result indicates that the second demodulated voltage is greater than the first demodulated voltage, the FSM controls the external oscillator to switch the injection frequency from a first frequency to a second frequency.

15. The XO of claim 14, wherein the sequence of demodulated voltages further comprises a third demodulated voltage following the second demodulated voltage; and when the monitored result indicates that the third demodulated voltage is greater than the second demodulated voltage, the FSM controls the external oscillator to switch the injection frequency from the second frequency to a third frequency; wherein the first frequency is greater than the second frequency, and the second frequency is greater than the third frequency; or the first frequency is less than the second frequency, and the second frequency is less than the third frequency.

16. The XO of claim 11, wherein the sequence of demodulated voltages comprises a first demodulated voltage and a second demodulated voltage following the first demodulated voltage, and the monitoring circuit comprises:

an amplifier, coupled to the demodulation circuit, configured to receive the sequence of demodulated voltages through a first input terminal of the amplifier;

a capacitor, coupled to a second input terminal of the amplifier, configured to sequentially store the sequence of demodulated voltages; and a loop switch, coupled between the second input terminal and an output terminal of the amplifier, configured to control configurations of the monitoring circuit;

wherein when the loop switch is turned on, the monitoring circuit is configured as a unit gain buffer to transmit the first demodulated voltage from the first input terminal of the amplifier to the capacitor; and when the loop switch is turned off, the monitoring circuit is configured as a comparator to compare the second demodulated voltage on the first input terminal of the amplifier with the first demodulated voltage stored on the capacitor, and accordingly generates a comparison result, wherein the monitored result comprises the comparison result.

17. The XO of claim 11, wherein the demodulation circuit comprises:

a diode, having a cathode coupled to a sampling node of the demodulation circuit;

a reset switch, coupled between the sampling node and a reference terminal of the demodulation circuit;

a sampling switch, coupled to an anode of the diode; and a sampling capacitor, coupled to the sampling node;

wherein when the reset switch is turned on and the sampling switch is turned off during a reset period, a voltage level of the sampling node is reset to a reference level of the reference terminal; and when the reset switch is turned off and the sampling switch is turned on during a sampling period, charges are accumulated on the sampling node in response to a voltage level of the modulation signal exceeding a threshold corresponding to the diode, to generate a demodulated voltage of the sequence of demodulated voltages on the sampling node.

18. The XO of claim 11, wherein an initial demodulated voltage represents a first demodulated voltage of the sequence of demodulated voltages; and when a target demodulated voltage of the sequence of demodulated voltages is detected to indicate that the startup process is completed, the at least one injection switch is turned off, wherein a voltage difference between the target demodulated voltage and the initial demodulated voltage is greater than or equal to a predetermined value.

19. A monitoring circuit for generating consecutive comparison results of a sequence of demodulated voltages carrying information of relative phase between an injected signal and an intrinsic oscillation signal of a XO, the monitoring circuit comprising:
- an amplifier, configured to receive the sequence of demodulated voltages through a first input terminal of the amplifier, wherein the sequence of demodulated voltages comprises a first voltage and a second voltage following the first voltage;
- a capacitor, coupled to a second input terminal of the amplifier, configured to sequentially store the sequence of demodulated voltages; and
- a loop switch, coupled between the second input terminal and an output terminal of the amplifier; configured to control configurations of the monitoring circuit;
- wherein when the loop switch is turned on, the monitoring circuit is configured as a unit gain buffer to transmit the first voltage from the first input terminal of the amplifier to the capacitor; and when the loop switch is turned off, the monitoring circuit is configured as a comparator to compare the second voltage on the first terminal of the amplifier with the first voltage stored on the capacitor, and accordingly generates a comparison result of the consecutive comparison results, wherein the comparison result carrying information of relative phase between the injected signal and the intrinsic oscillation signal of a XO is utilized to control an injection frequency of the injection signal.

20. The monitoring circuit of claim 19, wherein when the loop switch is turned on, an intrinsic offset caused by mismatch of the first input terminal and the second input terminal of the amplifier is stored on the capacitor in conjunction with the first voltage, thereby preventing the comparison result being affected by the intrinsic offset.

* * * * *